United States Patent [19]

Liebes, Jr. et al.

[11] Patent Number: 5,034,802
[45] Date of Patent: Jul. 23, 1991

[54] MECHANICAL SIMULTANEOUS REGISTRATION OF MULTI-PIN SURFACE-MOUNT COMPONENTS TO SITES ON SUBSTRATES

[75] Inventors: Sidney Liebes, Jr., Atherton; John Birk, Los Altos, both of Calif.

[73] Assignee: Hewlett-Packard Company, Palo Alto, Calif.

[21] Appl. No.: 448,495

[22] Filed: Dec. 11, 1989

[51] Int. Cl.$^5$ ................ H01L 23/02; H01L 23/12
[52] U.S. Cl. ........................... 357/74; 357/80; 361/400; 269/903; 29/832; 29/834
[58] Field of Search ............... 357/72, 74, 80; 174/52.4; 361/392, 395, 400; 269/903; 29/832, 834

[56] References Cited

U.S. PATENT DOCUMENTS

| | | | |
|---|---|---|---|
| 3,521,128 | 7/1970 | Oates | 357/74 |
| 3,695,502 | 10/1972 | Gaiser | 228/4 |
| 3,930,295 | 1/1976 | Rose | 29/203 P |
| 4,528,747 | 7/1985 | Hoffman et al. | 29/834 |
| 4,670,770 | 6/1987 | Tai | 357/60 |
| 4,670,981 | 6/1987 | Kubota et al. | 29/840 |
| 4,733,462 | 3/1988 | Kawatani | 29/840 |
| 4,883,300 | 11/1989 | Akagawa | 294/2 |

OTHER PUBLICATIONS

"How to Use Surface Mount Technology", Jerry Mullen, *Texas Instruments Corp.*, (1984): and Solderability: A Key to Successful Surface Mount Assembly, Richard S. Murphy (1988) *Printed Circuit Assembly*, pp. 20-23.

*Primary Examiner*—Rolf Hille
*Assistant Examiner*—David Ostrowski

[57] ABSTRACT

A method and structure are provided for aligning SMDs to a substrate. The body of an SMD and that portion of a substrate encircled by the electrical interconnect pads each have a mating physical structure such that the SMD may be quickly placed in the general vicinity of its proper location and the mating physical features cause a precise alignment. In one embodiment, the physical features are nonsymmetrical, thereby preventing accidental placement of the SMD in an undesired rotation. In another embodiment, the physical features vary among device types, thereby ensuring that an improper device is not placed in a particular location on the substrate. In another embodiment, a component carrier is provided which includes depressions for the placement of the SMDs. A vacuum is applied to the carrier which holds each of the SMDs in place. The carrier is then placed in a desired physical relationship with the substrate such that each of the devices held in the carrier is properly aligned with the substrate. In another embodiment, a standard substrate is used without the requirement of physical mating features. Those physical mating features are provided by the use of a grid structure which is placed with proper registration on the substrate such that the physical pattern of the grid ensures proper placement of components with respect to the pads on the substrate.

5 Claims, 3 Drawing Sheets

MECHANICAL SIMULTANEOUS REGISTRATION OF MULTI-PIN SURFACE-MOUNT COMPONENTS TO SITES ON SUBSTRATES

INTRODUCTION

1. Technical Field

This invention pertains to electronic assembly techniques, and more particularly to techniques and structures suitable for the placement and alignment of surface mount devices (SMDs) on a substrate such as a printed circuit board.

2. Background

Electronic fabrication techniques are well known. It is widely recognized that smaller components are desirable in order to miniaturize electronic assemblies and reduce their cost. These factors have led to the increased use of integrated circuits, in that a relatively large amount of circuitry can be fabricated on a small semiconductor surface which is encapsulated in a relatively small package which in turn is placed on a substrate, such as a printed circuit board, which contains and interconnects a plurality of integrated circuits and discrete components.

Dual in-line (DIP) integrated circuit packages are well known and have become increasingly large with increased integrated circuit complexity. While DIP packages allow complex integrated circuits to be fabricated which replace much larger circuits constructed of discrete components, nevertheless DIP packages have become large and cumbersome. For these reasons, SMDs have come into favor, with their lower profile, increased lead density, and potential cost and performance improvements. However, unlike the DIP packages which are relatively easy to hold and place by either manual or automated means, SMDs do not include leads which penetrate the substrate, requiring other means to assure proper registration of the SMD with respect to the substrate and the electrical interconnects located on the substrate. While the absence of penetrating electrical leads makes SMDs a desirable choice of further miniaturization over DIPs, it leads to difficulties in handling and registration of the SMDs.

As shown in FIG. 1, SMD 10 has a relatively low profile, typically 0.05 to 0.20 inches thick, and a plurality of electrical connections 11 for mounting to receiving pads 12 on substrate 13. Typically, solder is used to affix each electrical connection 11 on SMD 10 to an associated one of pads 12 on substrate 13. Currently, the state of the art provides that the pitch of an SMD (the width of a lead plus the width of an interlead spacing) is on the order of 0.016 to 0.050 inches. The width of a lead is approximately 50% of the pitch. The width of the pad to which the lead will be soldered is made slightly greater than that of the lead in order to allow for proper solder filleting. As is well known, a layer of solder paste is placed in desired portions of the substrate, i.e., on the pads, for example using a silk-screen technique. The SMDs are then placed on the substrate, with alignment being achieved by machine vision or by mechanical registration of features of the SMD with fiducial art on the substrate. The solder paste is then often reflowed, for example by placing the entire substrate with components carefully resting thereon in an oven, thereby effecting solder connections of the SMD connection to the substrate pads.

Unfortunately, this prior art technique of aligning SMDs to a substrate requires a relatively precise machine for alignment, which is expensive to construct and maintain. Furthermore, the SMD connections are placed directly on the pads of the substrate when the solder paste located therebetween is reflowed, thereby squeezing out melted solder and resulting in an uneven and often times inadequate amount of solder connecting a SMD connector 11 with a pad 12 of substrate 13.

One example of a prior art mounting technique is described in U.S. Pat. No. 4,670,981. This prior art technique utilizes a jig for temporary storage of components, which components are then transferred to a substrate for mounting by a plurality of vacuum probes which lift the components from the jig. Unfortunately, this prior art technique is rather cumbersome and expensive and, as noted in the '981 patent, leads itself to registration inaccuracies in the placement of devices on the substrate.

It is also known in the prior art to use an aligning jig to assemble printed circuit boards. Such an aligning jig would include, for example, an aluminum plate having a pattern formed therein in order to nest integrated circuit devices such that their leads will properly line up with solder pads or holes on a printed circuit board.

Additional information pertaining to surface mount devices is available in many references, of which the following are representative: "How To Use Surface Mount Technology", Jerry Mullen, Texas Instruments Corporation, (1984), and "Solderability: A Key to Successful Surface Mount Assembly", Richard S. Murphy, Printed Circuit Assembly, March 1988, pages 20-23.

SUMMARY OF THE INVENTION

In accordance with the teachings of this invention, a novel method and structure are provided for aligning SMDs to a substrate. The body of an SMD and that portion of a substrate encircled by the electrical interconnect pads each have a mating physical structure such that the SMD may be quickly placed in the general vicinity of its proper location and the mating physical features cause a precise alignment.

In accordance with one embodiment of this invention, the physical features are nonsymmetrical, thereby preventing accidental placement of the SMD in an undesired angular orientation.

In accordance with another embodiment of this invention, the physical features vary among device types, thereby ensuring that an improper device is not placed in a particular location on the substrate.

In accordance with the teachings of another embodiment of this invention, a component carrier is provided, which includes depressions for the placement of the SMDs. In one embodiment, a vacuum is applied to the carrier which holds each of the SMDs in place. The carrier is then placed in a desired physical relationship with the substrate such that each of the devices held in the carrier is properly aligned with the substrate.

In another embodiment of this invention, a standard substrate is used without the requirement of physical mating features. Those physical mating features are provided by the use of a grid structure which is placed with proper registration on the substrate such that the physical pattern of the grid ensures proper placement of components with respect to the pads on the substrate.

In another embodiment of this invention, a component jig is used which includes a plurality of relatively large openings for the initial placement of components, which openings are tapered down to a more precisely sized aperture. The components may be roughly placed in the relatively wide openings, and then slide down by gravity or other means, into the more precisely sized opening, thereby insuring quite accurate final registration as a result of relatively coarse initial placement. The loose initial placement tolerance for this operation enables use of inexpensive placement equipment.

BRIEF DESCRIPTION OF THE DRAWINGS

FIG. 2b depicts a portion of a substrate constructed in accordance with one embodiment of this invention suitable for placement of the SMD of FIG. 2a;

DESCRIPTION OF SPECIFIC EMBODIMENTS

Figure 1:
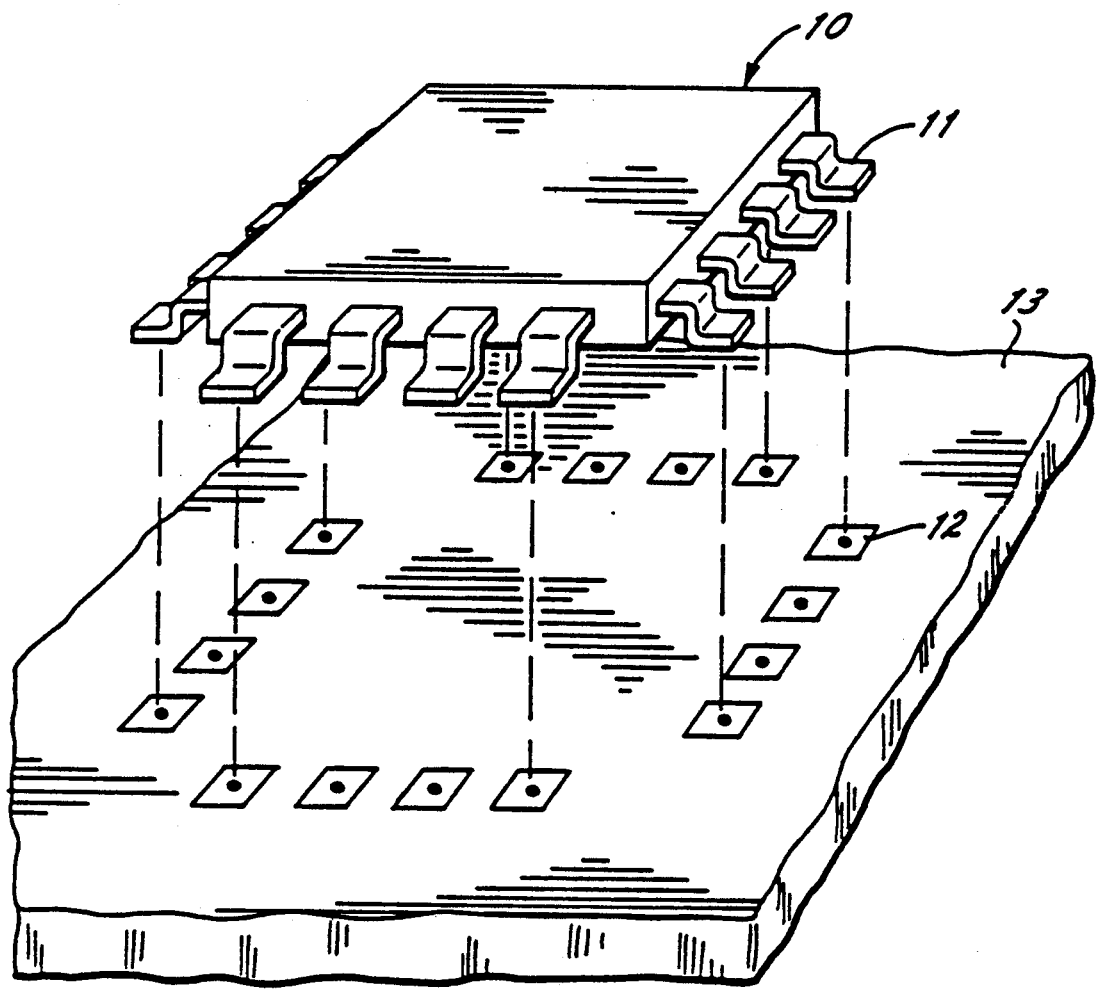
FIG. 1 depicts a prior art substrate, such as a printed circuit board, and a prior art SMD located above the substrate and poised for mounting on the substrate.
Figure 2A:
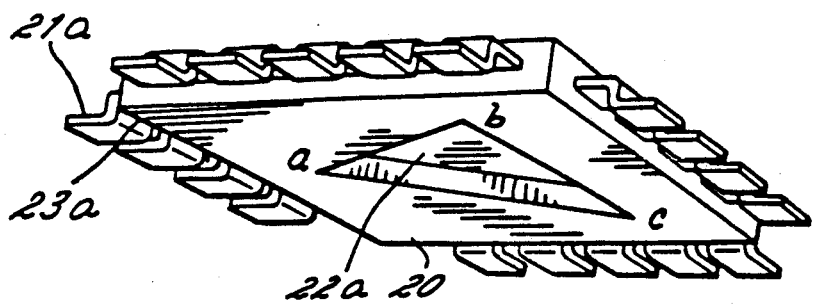
FIG. 2a is an oblique upward view of one embodiment of an SMD constructed in accordance with the teachings of this invention.

FIG. 2a depicts the underside of one embodiment of an SMD 20 constructed in accordance with the teachings of this invention. As shown in FIG. 2a, SMD 20 includes a plurality of leads 21a emanating from its periphery, although it is to be understood that this invention pertains equally to the leadless chip carrier (LCC) type of SMD which includes electrical interconnections formed on the periphery of its body 23a, as opposed to leads 21a extending therefrom. Formed within body 23a is mechanical registration means 22a which, in this embodiment, is shown as a 3-sided depression near the center of body 23a. Registration means 22a can take any desired shape and need not be a depression, but rather can be a protuberance or a combination of depressions and protuberances. Registration means 22a can have sloped sides matching a mating feature 22b on the substrate (FIG. 2b), thereby allowing SMD 20 to be placed with large tolerance in the general vicinity of proper location on a substrate. The sloped edges of registration means 22a cause SMD 20 to be properly aligned via lateral compliance of an inexpensive, low tolerance placement tool (not shown, but well known in the art) with great accuracy such that its leads 21a are accurately aligned to pad areas on the substrate. Alternatively, registration means 22a can have substantially vertical sidewalls or a combination of sloped and vertical sidewalls.

In one embodiment of this invention, the body of SMD 20 is approximately 500 mils sq., approximately 100 mils thick, registration means 22a is approximately 20 mils in depth and approximately 400 mils at its greatest width. Naturally, the teachings of this invention are equally applicable to SMDs of any size and a wide range of sizes and configurations of registration means 22a is possible. In one embodiment, not one but a plurality of registration means 22a are used on a single SMD. In one embodiment, registration means 22a is non-symmetrical, thereby assuring that SMD 20 is properly placed on the substrate, rather than rotated for example by 90 or 180 degrees. In one embodiment of this invention, separate configurations of registration means are used for each separate device type, thereby assuring that each area on the substrate receives the appropriate device type.

Figure 2B:
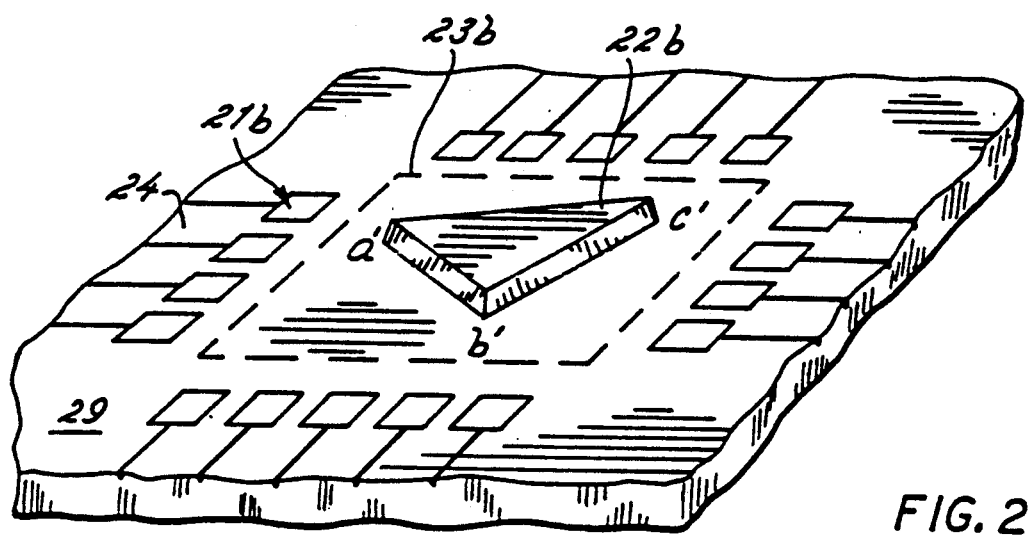

FIG. 2b depicts a portion of a substrate 29 which has been fabricated in accordance with this invention to receive SMD 20 of FIG. 2a. As shown in FIG. 2b, substrate 29 includes registration means 22b which matches registration means 22a of FIG. 2a. Thus, since the embodiment shown in FIG. 2a includes a depression serving as registration means 22a, substrate 29 of FIG. 2b includes a matching protrusion serving as registration means 22b. Also shown in FIG. 2b are electrical pads 21b for alignment with and ultimate connection to leads 21a of FIG. 2a. In accordance with one embodiment of this invention, the height of registration means 22b is greater than the depth of registration means 22a by a distance within the range of approximately 0.004 to 0.025 inches, in order to cause a slight gap between leads 21a and pad areas 21b, thereby ensuring a more uniform and adequate amount of solder connecting leads 21a and pads 21b.

Figure 3:
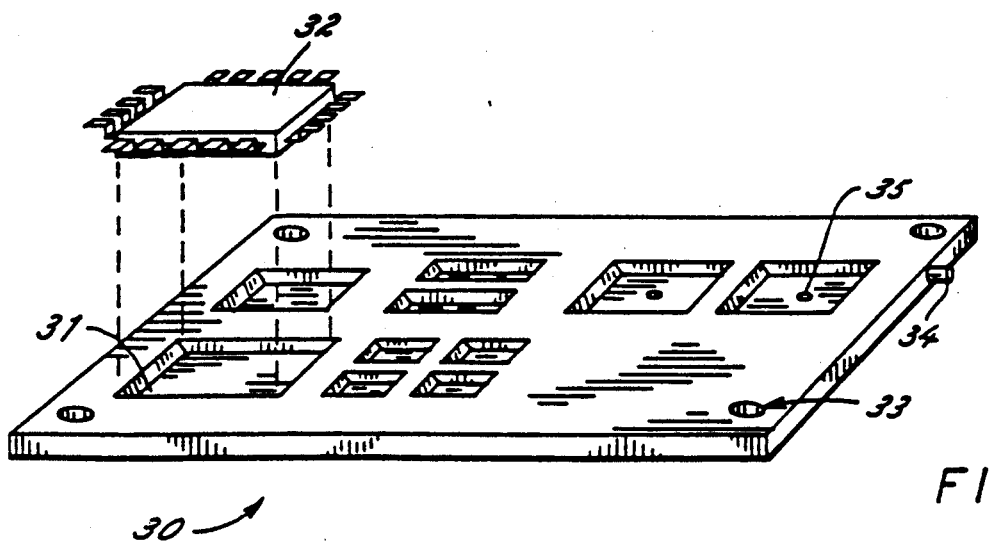
FIG. 3 is a view depicting one embodiment of a component carrier constructed in accordance with the teachings of this invention, together with an SMD and an indication of the placement of that SMD within the carrier.

FIG. 3 depicts one embodiment of a component carrier 30 constructed in accordance with another embodiment of this invention. As shown in FIG. 3, component carrier 30 includes one or more registration areas 31 for properly registering a component 32. If desired, registration area 31 and component 32 can have matching physical registration features, as described with regard to the embodiments of FIGS. 2a and 2b. Carrier 30 also includes one or more alignment means 33, e.g. holes or pegs, or visual or magnetic fiducials, for ensuring proper alignment of a substrate (not shown) to carrier 30, and thus in turn assuring proper alignment of the substrate to components 32. In one embodiment, the substrate is placed on top of carrier 30 once carrier 30 has been properly loaded with components. In another embodiment, vacuum port 34 is provided for applying a vacuum to carrier 30 which is fed by internal channels to vacuum ports 35, allowing components 32 to be properly held in carrier 30, even when carrier 30 is turned upside down. This embodiment allows carrier 30 to be turned to any desired orientation for placement on top of the substrate (not shown), affording greater flexibility in the manufacturing process. This embodiment also enables the leads of all devices to have solder paste applied simultaneously, e.g., by a rolling, pressing, or dipping action.

Figure 4:
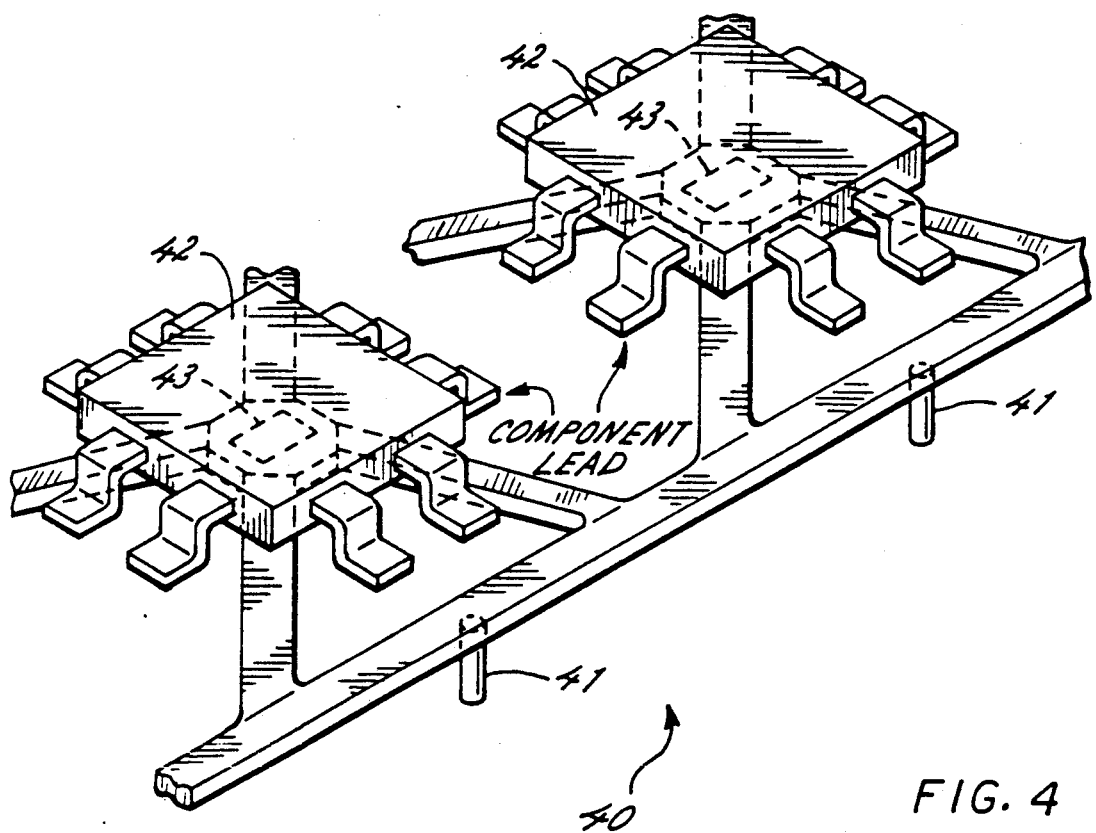
FIG. 4 depicts one embodiment of a grid structure constructed in accordance with the teachings of this invention for mounting on a substrate and containing registration features for properly aligning SMDs to the substrate.

FIG. 4 depicts another embodiment of this invention wherein a grid assembly 40 is placed in proper alignment on a substrate (not shown), for example by means of substrate alignment means 41 which may comprise pins or the like. Grid 40 includes a plurality of registration features 43 for properly aligning components 42 with respect to grid 40 and thus with respect to the underlying substrate. In this embodiment, typical prior art substrates can be used without requiring those substrates to include registration means other than those needed to properly register the substrate with grid 40. This allows inexpensive substrates to be used together with an inexpensive grid 40 which may be fabricated from any suitable material, such as plastic or metal.

If desired, grid 40 can remain on the substrate after assembly, assuming it will not be physically in the way and will not cause undesirable electrical paths. In an alternative embodiment, all or part of grid 40 is removed once components 42 are properly attached, i.e., by soldering to the substrate. In one embodiment of this invention, suitable break points are located within grid 40 surrounding components 42, thereby allowing that portion of grid 40 underlying components 42 to remain, thereby preventing disturbance to components 42, while allowing the remaining portions of grid 40 to be removed from the surface of the substrate. Utilizing grid 40 also allows the thickness of grid 40 to be selected in order to cause a slight gap between the leads of component 42 and the pads of the substrate (not shown), thereby insuring a more uniform and full shape to the reflowed solder connecting the leads to the substrate. In one embodiment of this invention, that portion of grid assembly 40 holding device 42 has a thickness which is approximately 0.004 to 0.025 inches greater than the depth of the registration means on the SMD. Naturally, if desired, other portions of grid assembly 40 can have thicknesses greater than or less than the thickness that portion of grid assembly 40 holding device 42.

In accordance with this embodiment, a typical fabrication sequence is as follows:

1. Fabricate substrate, such as a printed circuit board.
2. Form grid registration attributes on the substrate if not formed in step 1.
3. Apply solder paste to the pads on the substrate, for example using a prior art technique.
4. Install grid onto substrate utilizing grid alignment features.
5. Place components on grid, with grid assuring proper registration of component leads and substrate pads.
6. Heat assembly in order to cause reflow of the solder paste, thereby assuring good solder bond between component leads and substrate pads.
7. If desired, remove all or desired portions of grid from substrate.

Figure 5:
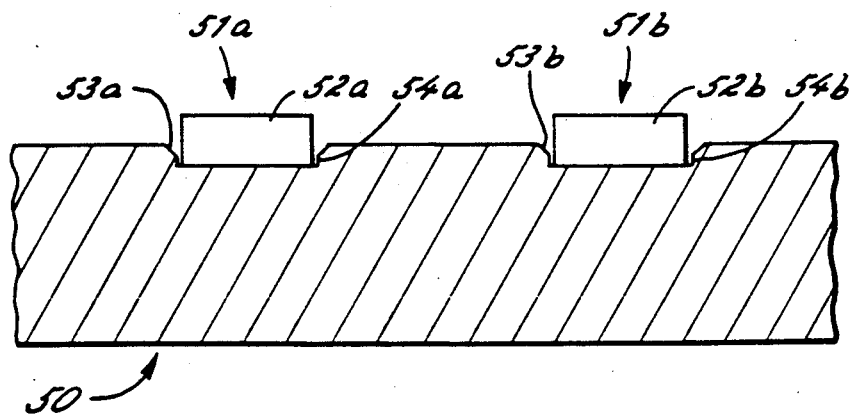
FIG. 5 depicts one embodiment of a carrier structure constructed in accordance with the teachings of this invention which includes a relatively large funnel aperture for the coarse guidance of devices, and a more precisely located and sized aperture for the final resting of a component prior to transfer to a substrate.

FIG. 5 depicts one embodiment of a component carrier or jig 50 which includes a plurality of relatively coarse surface openings 51a and 51b. Openings 51a and 51b are relatively large as compared with the size of components of 52a and 52b which are placed therein. This allows for relatively quick and inaccurate placement of components 52a and 52b within openings 51a and 51b. The sides of 51a and 51b are tapered, narrowing into final resting apertures 54a and 54b. Thus, components 52a and 52b may be roughly placed with very inexpensive equipment at a rapid rate, and then slide down sidewalls 53a and 53b into final resting positions 54a and 54b. In this manner, very coarse initial placement of components 52a and 52b results in very accurate final placement in locations 54a and 54b. With carrier 50 appropriately and precisely placed with respect to the substrate, components 52a and 52b are then transferred to the substrate, for example using a vacuum transport device which transports each component a fixed displacement in the x and y directions.

All publications cited in this specification are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A structure for mounting devices on a substrate comprising:
    a grid structure for aligning electrical leads of electronic components to be mounted on a printed circuit board with connection pads carried by the board;
    the gird structure having a plurality of locations each adapted to receive an electronic component;
    a registration feature at each said location, each registration feature shaped complemental to a registration feature on a component which is to be received at that location;
    a plurality of openings through the grid structure, the openings positioned such that electrical leads of components positioned at said locations extend through the openings; and
    means for aligning the grid structure with the printed circuit board such that electrical leads of components positioned at said locations are in alignment with the connection pads on the printed circuit board.

2. A structure as in claim 1 wherein the registration features are selected from the group comprising depressions and protrusions.

3. A structure as in claim 1 wherein at least one registration feature is nonsymmetrical, thereby insuring a desired orientation of the component which is to be received at that location with respect to the circuit board.

4. A structure as in claim 1 wherein the grid structure comprises a plurality of break-away portions.

5. A structure as in claim 1 wherein the means for aligning the structure with the circuit board comprises a plurality of pins carried by the structure for reception into mating receptacles in the circuit board.

* * * * *